United States Patent
Mutnury et al.

(10) Patent No.: US 12,525,961 B2
(45) Date of Patent: Jan. 13, 2026

(54) DYNAMIC ADJUSTMENT OF TRANSMISSION LINE LOSS

(71) Applicant: DELL PRODUCTS L.P., Round Rock, TX (US)

(72) Inventors: Bhyrav Mutnury, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 52 days.

(21) Appl. No.: 18/614,937

(22) Filed: Mar. 25, 2024

(65) Prior Publication Data
US 2024/0235530 A1 Jul. 11, 2024

Related U.S. Application Data

(63) Continuation of application No. 17/966,643, filed on Oct. 14, 2022, now Pat. No. 11,990,882.

(51) Int. Cl.
*H03H 11/24* (2006.01)
(52) U.S. Cl.
CPC ................................. *H03H 11/245* (2013.01)
(58) Field of Classification Search
None
See application file for complete search history.

(56) References Cited

U.S. PATENT DOCUMENTS

| | | | |
|---|---|---|---|
| 6,597,198 B2 * | 7/2003 | Haycock | H03K 19/018592 326/82 |
| 8,779,870 B2 | 7/2014 | Sun et al. | |
| 9,024,702 B2 * | 5/2015 | Shin | H03H 11/245 333/81 R |
| 9,178,626 B2 | 11/2015 | Mutnury et al. | |
| 10,063,215 B2 | 8/2018 | McNamara | |
| 10,211,831 B1 * | 2/2019 | Chan | H04L 25/0278 |
| 10,498,383 B2 | 12/2019 | Srirattana | |
| 10,707,834 B2 * | 7/2020 | Kondo | H03H 7/185 |
| 10,950,369 B1 | 3/2021 | Farkas et al. | |
| 12,289,086 B2 * | 4/2025 | Mehrpoo | H03H 11/24 |
| 2021/0321510 A1 | 10/2021 | Farkas et al. | |
| 2023/0344174 A1 | 10/2023 | Mutnury et al. | |

* cited by examiner

*Primary Examiner* — Jeffrey S Zweizig
(74) *Attorney, Agent, or Firm* — Larson Newman, LLP

(57) ABSTRACT

A computing cable comprising a trace having a first impedance and an attenuator that includes a fixed resistor having a second resistance, a variable resistor having a first resistance, and a conductor having a second impedance. The combination of the first resistance, the second resistance, and the second impedance is based on the first impedance, wherein the first resistance is varied dynamically at runtime based on a control input.

20 Claims, 12 Drawing Sheets

110

DYNAMIC ADJUSTMENT OF TRANSMISSION LINE LOSS

CROSS-REFERENCE TO RELATED APPLICATION

This application is a Continuation of U.S. patent application Ser. No. 17/966,643 entitled "DYNAMIC ADJUSTMENT OF TRANSMISSION LINE LOSS" filed Oct. 14, 2022, the disclosure of which is hereby expressly incorporated by reference in its entirety.

FIELD OF THE DISCLOSURE

The present disclosure generally relates to information handling systems, and more particularly relates to dynamic adjustment of transmission line loss.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A computing cable comprising a trace having a first impedance and an attenuator that includes a fixed resistor having a second resistance, a variable resistor having a first resistance, and a conductor having a second impedance. The combination of the first resistance, the second resistance, and the second impedance is based on the first impedance, wherein the first resistance is varied dynamically at runtime based on a control input.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Electrical/computing cables, or simply cables, have become an integral part of information handling systems. Cables may be used externally to connect multiple information handling systems, or internally to connect PCBs within an information handling system. When one or more servers are installed within a rack, for example, communication between racks can be easily accomplished through externally coupled cables. Internal cables are also commonly used within rack servers for connecting serial attached SCSI interfaces, serial advanced technology attachment, such as SATA interfaces or PCIe interfaces, and non-volatile memory backplanes.

Cables are commonly used in high-speed signal transmission applications. In particular, low-loss PCB materials and cables are typically used to send high-speed signals over long distances. However, the channels can be short, such as when the low-loss PCB materials and cables are used at shorter distances, where the low-loss materials in the PCB and cables do not as effectively dampen reflections and crosstalk. In addition, the response of the channel can change based on various conditions such as a change in temperature, humidity, when a device is hot-plugged, etc. As there is a variation in the length of cable used externally and internally, it would be beneficial to have the ability to dynamically adjust the channel or transmission loss, also simply referred to herein as loss, to the point where reflections are gone without introducing too much loss through the cables, wherein the loss may increase with the frequency. Accordingly, the present disclosure would determine the attenuation to be added dynamically as needed or desired based on the design without pre-determining the losses and using a fixed attenuator. By adjusting the attenuation, the transmission loss is dynamically adjusted and a change in the length of the cable is simulated, avoiding overloading of the circuitry.

Figure 1:
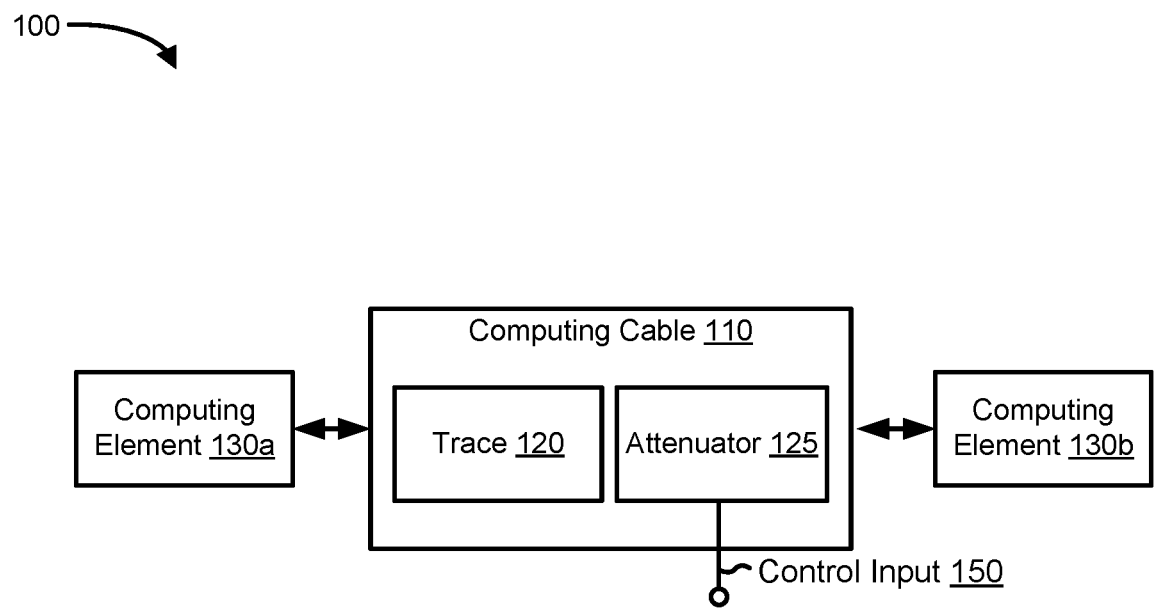
FIG. 1 is a block diagram illustrating a computing environment, according to an embodiment of the present disclosure.

FIG. 1 shows an environment 100 configured for dynamic adjustment of transmission line loss. Environment 100 includes a computing cable 110, a first computing element 130a, and a second computing element 130b. Computing cable 110 may also be referred to herein as a wire 110. Computing cable 110 includes a trace 120 and an attenuator 125. However, computing cable 110 can include any number of traces and attenuators. Computing cable 110 may be configured to connect first computing element 130a to second computing element 130b. In some examples, computing elements 130a and 130b are printed circuit boards (PCBs) of an information handling system. In other examples, computing elements 130a and 130b can be information handling systems, similar to information handling system 1200 of FIG. 12. In other examples, computing elements 130 are PCBs of an information handling system.

Computing cable 110 is shown to include a control input 150 to adjust the attenuation of attenuator 125. For example, the circuits disclosed herein may be implemented in a chip using a FET or MOSFET switch connected across an integrated transmission line and a linear gate control. A variable direct current control input or a digital control input driving an integrated digital-to-analog converter board may be used for control input 150 instead of a pulse-width modulation (PWM) power source as described herein. Control input 150 may be set to an initial value based on the desired attenuation and/or channel loss. The channel loss may be adjusted to the point where reflections are gone.

The circuit may be calibrated and/or trained to adjust the control signal up and down to compensate for part-to-part variations or environmental changes in a closed-loop operation. An open loop operation may be used, wherein control input 150 may also be driven based on values in a predefined function or lookup table. The chip may include an additional FET or MOSFET driven from the same control input. The resistance of this FET or MOSFET can be measured on a die and used for internal calibration. The result of this calibration may be used to modify the gate control curve to provide consistency and/or temperature compensation, which would make the open-loop operation more accurate.

During typical usage of the information handling system, there may be changes in various conditions, such as temperature, humidity that results in a variance between the calibrated resistance and the current resistance of attenuator 125. By adjusting control input 150, such as by altering the PWM signal, based on the conditions, the present disclosure may dynamically alter the variable resistance such that the variance between the current resistance and the calibrated resistance may be minimized. Control input 150 may be generated by a variable resistance controller which can be a complex programmable logic device (CPLD). Control input 150 may also be generated by a baseboard management controller (BMC) similar to BMC 1290 of FIG. 12. For example, the CPLD or BMC may detect the change in temperature at runtime and adjust the PWM percentage to compensate.

Figure 2:
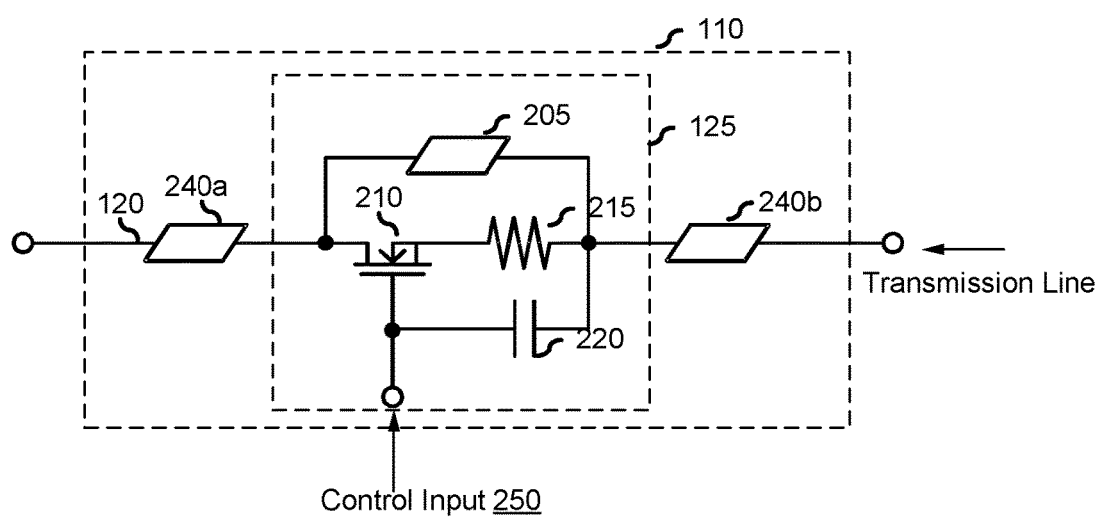
FIG. 2 is a schematic diagram illustrating a computing cable, according to an embodiment of the present disclosure.

FIG. 2 shows a circuit 200 of computing cable 110 of FIG. 1. As shown in FIG. 1, computing cable 110 can include trace 120 and attenuator 125. Trace 120 can include a first trace segment 240a and a second trace segment 240b, which are collectively referred to as trace segments 240. Attenuator 125 can include a conductor 205, a variable resistor 210, a fixed resistor 215, and a capacitor 220. Variable resistor 210 may be a field-effect transistor (FET) or a metal oxide semiconductor field effect transistor (MOSFET) with a strong drain-source on resistance ($R_{DS\ (on)}$) dependence on gate-to-source voltage ($V_{GS}$). So, the resistance of variable resistor 210 may be based on part of the adjustment of the $V_{GS}$.

Variable resistor 210 may be configured with a variable resistance to handle a wide frequency range and both signal polarities. Fixed resistor 215 may be configured with a fixed resistance that may be used to increase the overall resistance range of circuit 200. While fixed resistor 215 may be optional, having the fixed resistor in the circuit would ensure that the circuit would not have zero resistance. In addition, having fixed resistor 215 would allow the signal curve to be more linear.

Capacitor 220 may be driven with a control input 150 which can be a pulse PWM current source or a high-value series resistor. It may be desirable to drive the gate of variable resistor 210 with high impedance to minimize parasitic loading of the channels. Accordingly, in this example, capacitor 220 may be configured to hold the $V_{GS}$ and emulates as a floating supply, which is acting as a $V_{GS}$ filter. This allows variable resistor 210 to receive a fixed voltage. However, in some cases, the gate capacitance of the variable resistor may be enough, and no external cap is needed.

Trace 120 can be associated with first impedance $Z_1$. Accordingly, first trace segment 240a may be associated with first impedance $Z_1$ and second trace segment 240b may be associated with first impedance $Z_{GS}$. Attenuator 125 connects first trace segment 240a and second trace segment 240b. As indicated above, attenuator 125 includes variable resistor 210, fixed resistor 215, capacitor 220, and conductor 205. Variable resistor 210 and fixed resistor 215 are connected in parallel with conductor 205. In this example, conductor 205 may be associated with a second impedance $Z_2$.

While variable resistor 210 may be associated with a first resistance $R_1$ and fixed resistor 215 may be associated with a second resistance $R_2$. First resistance $R_1$ is the resistance value between the drain and source of variable resistor 210 during operation on $R_{DS\ (on)}$. Second resistance $R_2$ is a fixed resistance determined at the manufacture of the information handling system or the PCB. Total resistance $R_T$ may be the sum of first resistance $R_1$ and second resistance $R_2$. In some examples, the value of total resistance $R_T$ may be based on a desired loss of computing cable 110. Accordingly, because second resistance $R_2$ is fixed across various cable lengths, the value of first resistance $R_1$ may be varied based on total resistance $R_T$. A lower value of total resistance $R_T$ or first resistance $R_1$ results in an increase in the loss of computing cable 110. Conversely, a higher value of total resistance $R_T$ or first resistance $R_1$ results in a decrease in the loss of computing cable 110. The values of total resistance $R_T$ and of second impedance $Z_2$ are chosen such that $Z_1 = R_T \| Z_2$.

Figure 3:
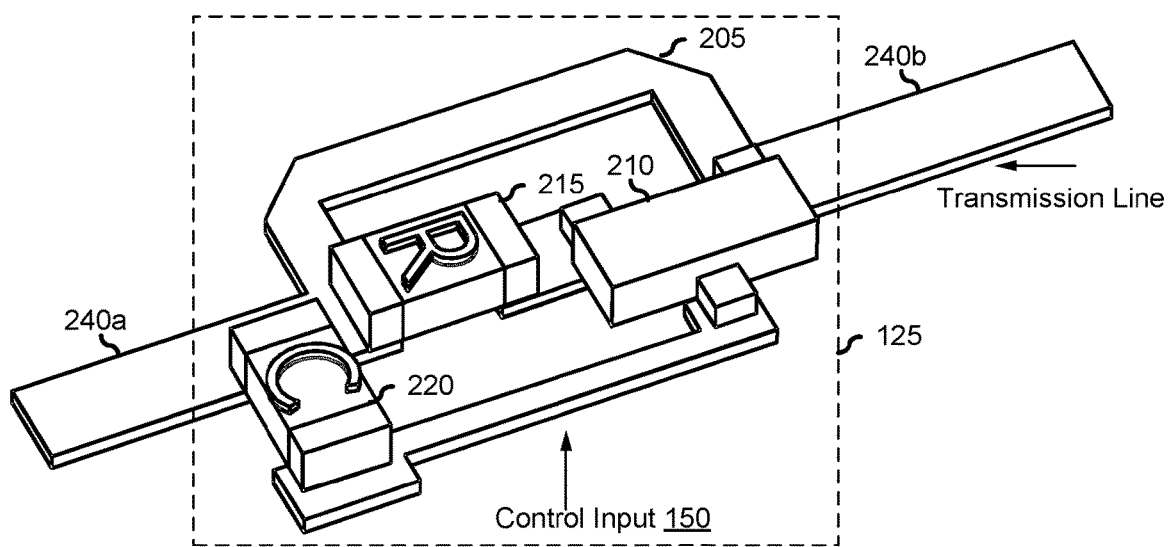
FIG. 3 is a diagram illustrating a top-down perspective view of a computing cable, according to an embodiment of the present disclosure.
Figure 4:
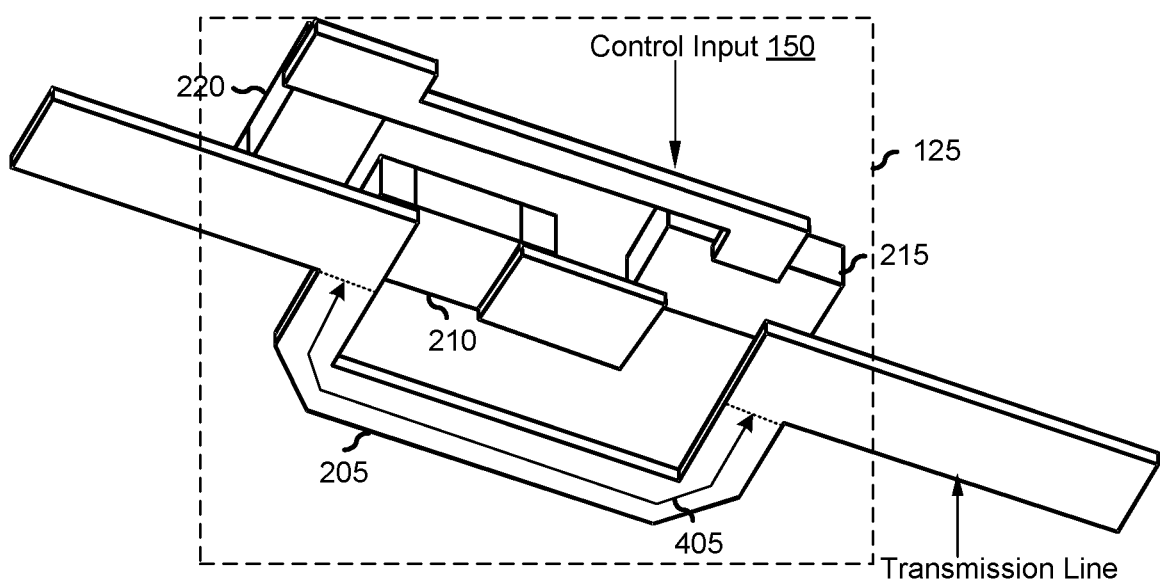
FIG. 4 is a diagram illustrating a bottom-up perspective view of a computing cable, according to an embodiment of the present disclosure.

FIG. 3 shows a top-down perspective view of computing cable 110 while FIG. 4 shows a bottom-up perspective view of computing cable 110, which depicts a length 405 of conductor 205. In this example, length 405 of the loop of conductor 205 may be defined as a total distance between first trace segment 240a and second trace segment 240b. Further, length 405 may be used to center the attenuator to a desired frequency range. For example, length 405 of conductor 205 may be based on a wavelength of a signal transmitted along trace segments 240. Also shown is how attenuator 125 connects first trace segment 240a and second trace segment 240b, wherein a transmission line may be coupled. Also depicted is a location where control input 150 may be provided at attenuator 125

Figure 5:
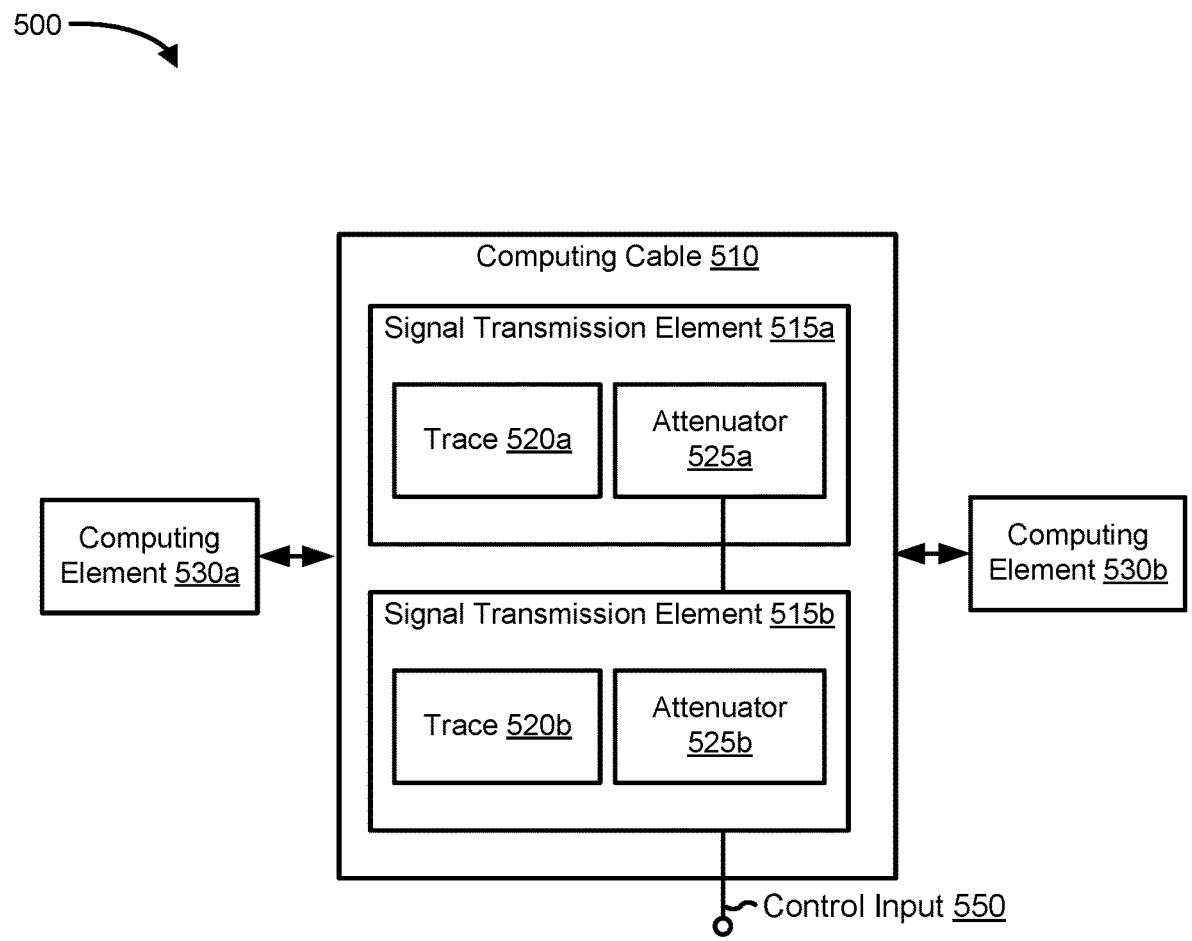
FIG. 5 is a block diagram illustrating a computing environment, according to an embodiment of the present disclosure.

FIG. 5 shows an environment 500 including a computing cable 510, a first computing element 530a, and a second computing element 530b. First computing element 530a and second computing element 530b may also be referred to as computing elements 530. Computing cable 510 includes a first signal transmission element 515a and a second signal transmission element 515b. First signal transmission element 515a and second signal transmission element 515b can collectively be referred to as signal transmission elements 515. First signal transmission element 515a can include a first trace 520a and a first attenuator 525a with a control input 550. Second signal transmission element 515b can include a second trace 520b and a second attenuator 525b with control input 550. However, computing cable 510 can include any number of traces and attenuators. In the illustrated embodiment, first transmission element 515a and second transmission element 515b are each controlled by the common control input 550. In this way, multiple signal transmission elements may be similarly controlled by a common control input. In a particular embodiment (not illustrated), second attenuator 525b has a separate control input. Here, multiple signal transmission elements may be controlled by separate control inputs. Thus, for example, signal transmission elements 515a and 515b may represent independent signal channels, or may represent a single differential signal channel, as needed or desired.

First trace 520a and second trace 520b can be collectively referred to as traces 520. First attenuator 525a and second attenuator 525b can be collectively referred to as attenuators 525. In some examples, computing elements 530 are information handling systems and can be similar to or includes the information handling system 1200 of FIG. 12. In other examples, computing elements 530 are PCBs of an information handling system.

Figure 6:
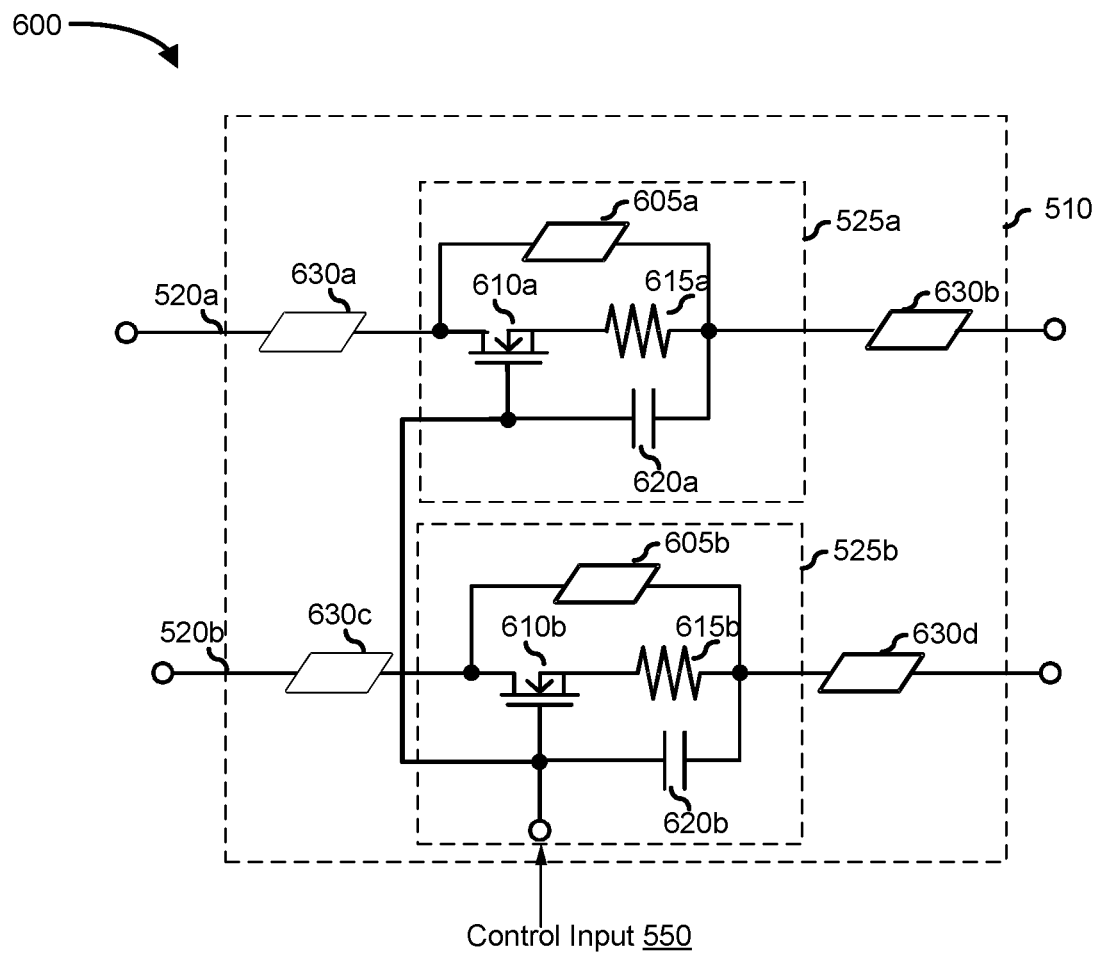
FIG. 6 is a schematic diagram illustrating a computing cable, according to an embodiment of the present disclosure.
Figure 7:
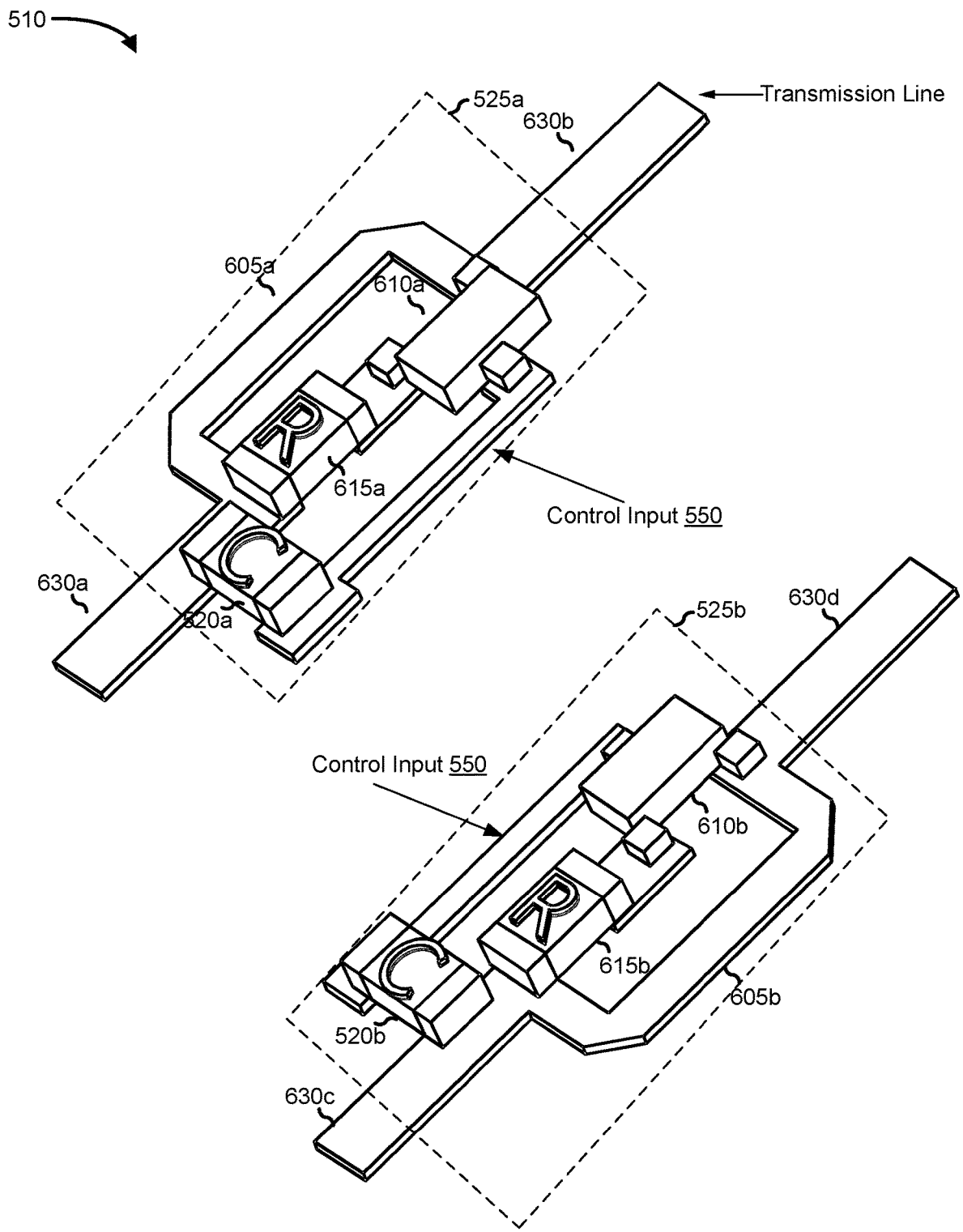
FIG. 7 is a diagram illustrating a top-down perspective view of a computing cable, according to an embodiment of the present disclosure.

FIG. 6 shows a circuit 600 of computing cable 510 of FIG. 5 while FIG. 7 shows a top-down perspective view of computing cable 510. As shown in FIG. 5, computing cable 510 can include traces 520 and attenuators 525. First attenuator 525a can include a first conductor 605a, a first variable resistor 610a, a first fixed resistor 615a, and a first capacitor 620a. Second attenuator 525b can include a second conductor 605b, a second variable resistor 610b, a second fixed resistor 615b, and a second capacitor 620b. First conductor 605a and second conductor 605b can be collectively referred to as conductors 605.

First variable resistor 610a and second variable resistor 610b can be collectively referred to as variable resistors 610. First fixed resistor 615a and second fixed resistor 615b can be collectively referred to as fixed resistors 615. The resistors are connected in parallel with their associated conductor. First capacitor 620a and second capacitor 620b can be collectively referred to as capacitors 620. Similar to variable resistor 210, variable resistors 610 may be FETs or MOS-FETs with strong $R_{DS\ (on)}$ dependence on $V_{GS}$. So, the resistance of variable resistors 210 may be based in part on the adjustment of the $V_{GS}$. In this embodiment, two FETs or MOSFETs are used for more accuracy. Fixed resistors 615, similar to fixed resistor 215, may be configured to increase the overall resistance range of circuit 600.

Capacitors 620, similar to capacitor 220, may be driven with control input 550, such as by a PWM current source or a high-value series resistor. It may be desirable to drive the gates with high impedance to minimize parasitic loading of the channels. Accordingly, in this example, capacitors 620 may be configured to hold the $V_{GS}$ and emulate floating supplies that are acting as $V_{GS}$ filters. This allows variable resistors 610 to receive a fixed voltage.

First trace 520a can include a first trace segment 630a and a second trace segment 630b, which may be connected by first attenuator 525a. First trace 520a can be associated with first impedance $Z_1$. Accordingly, first trace segment 630a may be associated with first impedance $Z_1$ and second trace segment 630b may be associated with first impedance $Z_1$. First conductor 605a may be associated with a second impedance $Z_2$. First variable resistor 610a may be associated with a first resistance $R_1$ and first fixed resistor 615a may be associated with a second resistance $R_2$. First resistance $R_1$ is the resistance value between the drain and source of first variable resistor 610a during operation on $R_T$. First subtotal resistance $R_{S1}$ may be the sum of first resistance $R_1$ and second resistance $R_T$. The values of first subtotal resistance $R_{S1}$ and of second impedance $Z_2$ are chosen such that $Z_1 = R_{S1} \| Z_2$.

Second trace 520b can include a third trace segment 630c and a fourth trace segment 630d, which can be connected by second attenuator 525b. Trace segments 630a-630d can be collectively referred to as trace segments 630. Second trace 520b can be associated with third impedance $Z_3$. Accordingly, third trace segment 630c may be associated with third impedance $Z_3$ and fourth trace segment 630d may be associated with third impedance $Z_3$.

Second conductor 605b may be associated with a fourth impedance $Z_4$. Second variable resistor 610b may be associated with a third resistance $R_3$ and second fixed resistor 615b may be associated with a fourth resistance $R_2$. Third resistance $R_3$ is the resistance value between the drain and source of second variable resistor 610b during operation on $R_{DS\ (on)}$. Second subtotal resistance $R_{S2}$ may be the sum of third resistance $R_3$ and fourth resistance $R_4$ The values of second subtotal resistance $R_{S2}$ and fourth impedance $Z_4$ are chosen such that $Z_3 = R_{S2} \| Z_4$.

In some examples, the value of first subtotal resistance $R_{S1}$ and second subtotal resistance $R_{S2}$ may equal total resistance $R_T$ which may be based on a desired loss of computing cable 510. Accordingly, because second resistance $R_2$ is fixed across various cable lengths, the value of first resistance $R_1$ may be varied based on first subtotal resistance $R_{S1}$. Similarly, the value of third resistance $R_3$ may be varied based on second subtotal resistance $R_{S2}$. A lower value of first subtotal resistance $R_{S1}$ or second subtotal resistance $R_{S2}$ may result in an increase in the loss of computing cable 510. Conversely, a higher value of first subtotal resistance $R_{S1}$ or second subtotal resistance $R_{S2}$ may result in a decrease in the loss of computing cable 510.

First attenuator 525a connects first trace segment 630a and second trace segment 630b while second attenuator 525b connects third trace segment 630c and fourth trace segment 630d. In this example, the length of the loop of conductors 605a and 605b may be used to center the attenuator to a desired frequency range. Here, the length of each of conductors 605a and 605b may be based on a wavelength of a signal transmitted along trace segments 630a-630d. In this example, the length of the loop of conductor 605a may be defined as the total distance between first trace segment 630a and second trace segment 630b.

A length of the loop of second conductor 605b may be defined as a total distance between third trace segment 630c and fourth trace segment 630d. Further, the lengths of each of conductors 605a and 605b may be used to center the attenuator to the desired frequency range. For example, the length of first conductor 605a may be based on a wavelength of a signal transmitted along trace segments 630a and 630b. Similarly, the length of second conductor 605b may be based on a wavelength of a signal transmitted along trace segments 630c and 630d.

Figure 8:
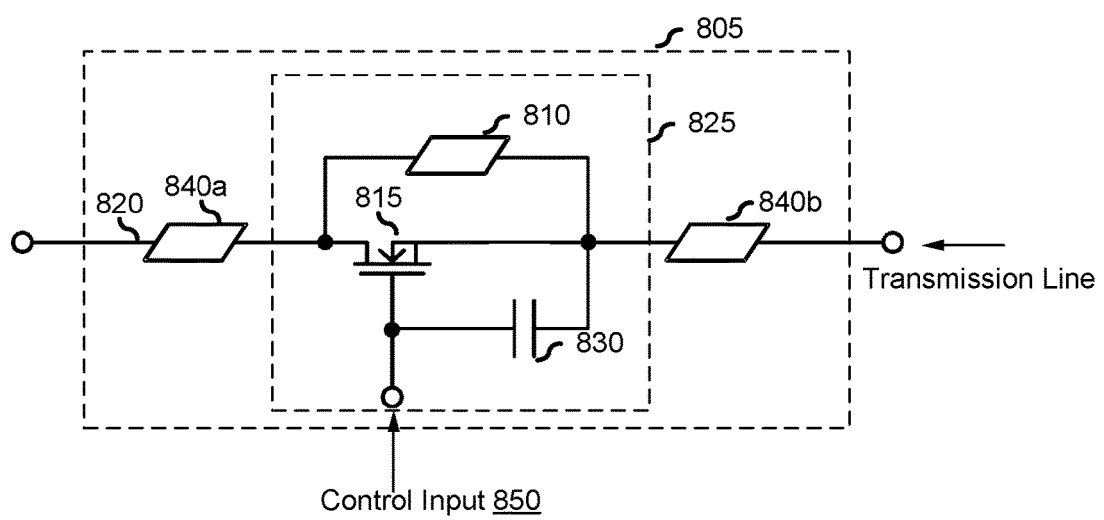
FIG. 8 is a schematic diagram illustrating a computing cable, according to an embodiment of the present disclosure.

FIG. 8 shows a circuit 800 of a computing cable 805. Computing cable 805 can include a trace 820 and an attenuator 825. Trace 820 can include a first trace segment 840a and a second trace segment 840b, which are collectively referred to as trace segments 840. Attenuator 825 can include a conductor 810, a variable resistor 815, and a capacitor 830. In this example, computing cable 805 does not have a fixed resistor, unlike circuit 200. Variable resistor 815 and conductor 810 are connected in parallel.

Similar to variable resistor 210, variable resistor 815 may be a FET or a MOSFET with a strong $R_{DS\ (on)}$ dependence on $V_{GS}$. So, the resistance of variable resistor 815 may be based on part of the adjustment of the $V_{GS}$. Variable resistor 815 may be configured to handle a wide frequency range and both signal polarities. Capacitor 830 may be driven with control input 850 via a PWM current source or a high-value series resistor. It may be desirable to drive the gates with high impedance to minimize parasitic loading of the channels. Accordingly, in this example, capacitor 220 may be configured to hold the $V_{GS}$ and emulates as a floating supply, which is acting as a $V_{GS}$ filter. This allows the voltage to variable resistor 210 to receive a fixed voltage. However, in some cases, the gate capacitance of the variable resistor may be enough, and no external cap is needed.

Trace 820 can be associated with the first impedance $Z_1$. Accordingly, first trace segment 840a may be associated with first impedance $Z_1$ and second trace segment 840b may be associated with first impedance $Z_1$. Attenuator 825 connects first trace segment 840a and second trace segment 840b. As indicated above, attenuator 825 includes variable resistor 815, capacitor 830, and conductor 810. In this example, conductor 810 may be associated with a second impedance $Z_2$.

First resistance $R_1$ is the resistance value between the drain and source of variable resistor 815 during operation on $R_{DS\ (on)}$. In some examples, the value of first resistance $R_1$ is based on a desired loss of computing cable 805. A lower value of first resistance $R_1$ results in an increase in the loss of computing cable 805. Conversely, a higher value first resistance $R_1$ results in a decrease in the loss of computing cable 805. The values of first resistance $R_1$ and second impedance $Z_2$ are chosen such that $Z_1=R_1\|Z_2$.

Figure 9:
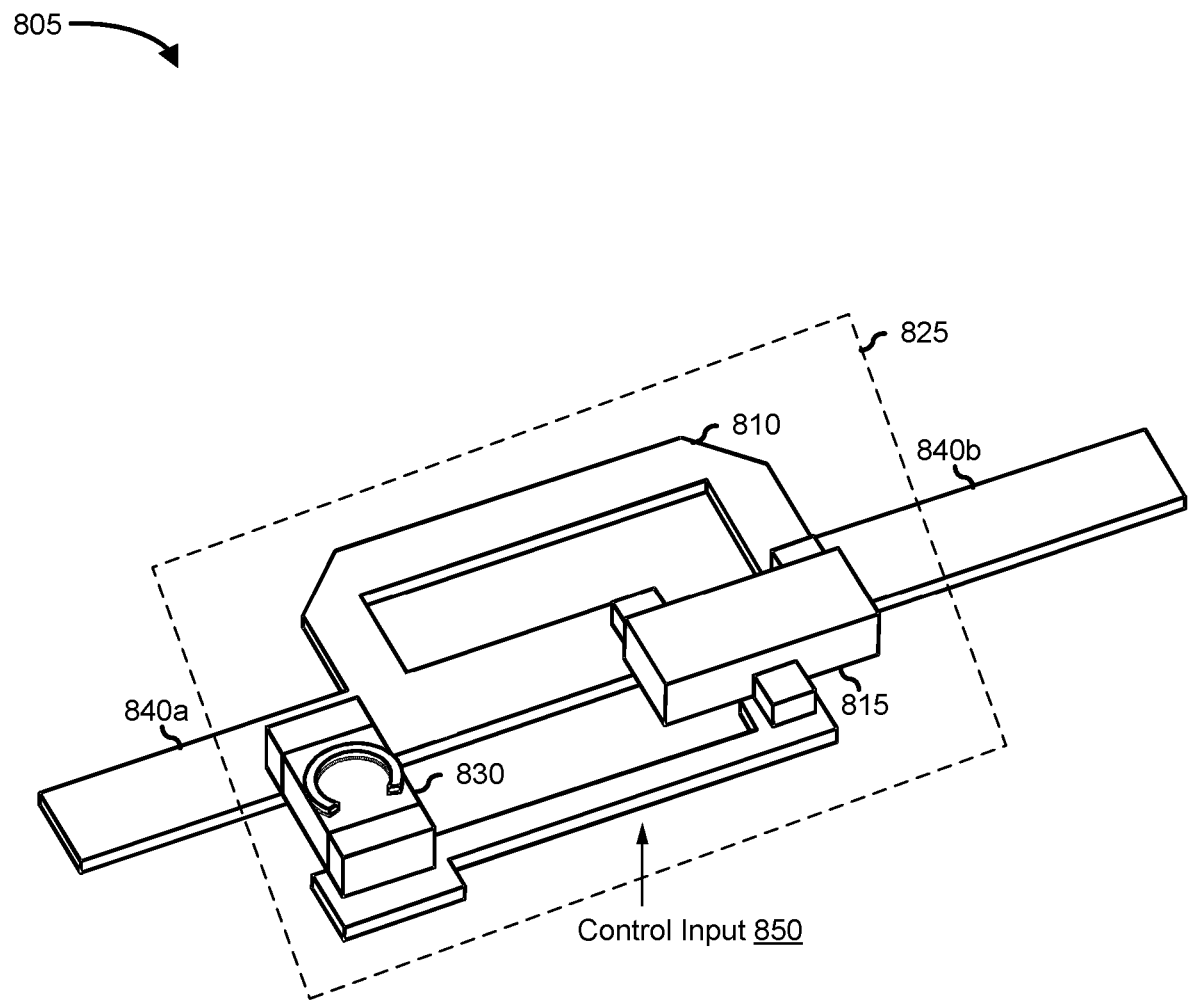
FIG. 9 is a diagram illustrating a top-down perspective view of a computing cable, according to an embodiment of the present disclosure.

FIG. 9 shows a top-down perspective view of computing cable 805. Attenuator 825 connects a first trace segment 840a and a second trace segment 840b. Attenuator 825 includes a variable resistor 815, a conductor 810, and a capacitor 830 with a control input 850 such as a PWM power source at its gate. In this example, the length of the loop of conductor 810 may be used to center the attenuator to a desired frequency range. Here, the length of conductor 810 may be based on a wavelength of a signal transmitted along trace segments 840.

Figure 10:
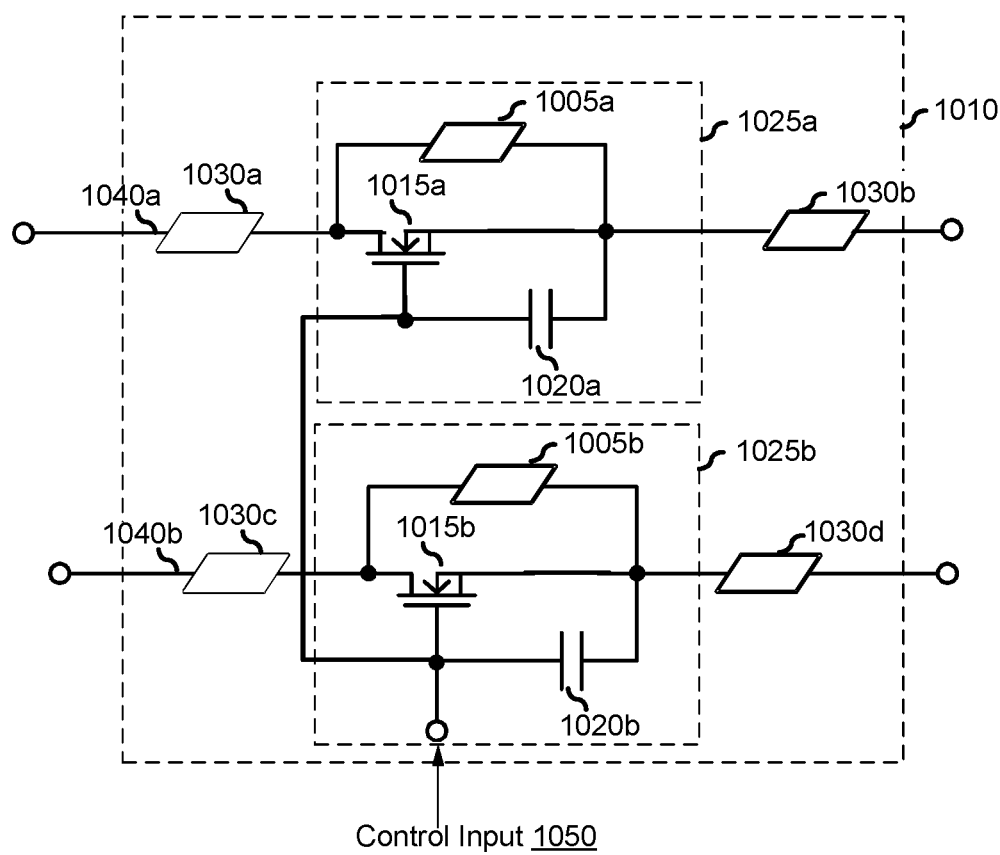
FIG. 10 is a schematic diagram illustrating a computing cable, according to an embodiment of the present disclosure.

FIG. 10 shows a circuit 1000 of computing cable 1010. Computing cable 1010 can include a first trace 1040a and a second trace 1040b, which can also be collectively referred to as traces 1040. First trace 1040a can include a first trace segment 1030a and a second trace segment 1030b while second trace 1040b can include a third trace segment 1030c and a fourth trace segment 1030d, which can be collectively referred to as trace segments 1030.

Computing cable 1010 can also include a first attenuator 1025a and a second attenuator 1025b. First attenuator 1025a can include a first conductor 1005a, a first variable resistor 1015a, and a first capacitor 1020a. Second attenuator 1025b can include a second conductor 1005b, a second variable resistor 1015b, and a second capacitor 1020b. First conductor 1005a and second conductor 1005b can be collectively referred to as conductors 1005. First variable resistor 1015a and second variable resistor 1015b can be collectively referred to as variable resistors 1015.

Each pair of fixed and variable resistors is connected in parallel to its associated conductor. For example, first conductor 1005a is connected in parallel with first variable resistor 1015a. Second conductor 1005b is also connected in parallel with second variable resistor 1015b. First capacitor 1020a and second capacitor 1020b can be collectively referred to as capacitors 1020. Similar to variable resistor 210, variable resistors 1015 may be MOSFETs with strong $R_{DS\ (on)}$ dependence on $V_{GS}$. So, the resistance of variable resistors 1015 may be based on part of the adjustment of the $V_{GS}$. In this embodiment, two MOSFETs are used for more accuracy.

First trace 1040a can include a first trace segment 1030a and a second trace segment 1030b, which are connected by first attenuator 1025a. First trace 1040a can be associated with first impedance $Z_1$. Accordingly, first trace segment 1030a may be associated with first impedance $Z_1$ and second trace segment 1030b may be associated with first impedance $Z_1$. First conductor 1005a may be associated with a second impedance $Z_2$. First variable resistor 1015a may be associated with a first resistance $R_1$. First resistance $R_1$ is the resistance value between the drain and source of first variable resistor 1015a during operation on $R_{DS\ (on)}$. The values of first resistance $R_1$ and of second impedance $Z_2$ are chosen such that $Z_1=R_{S1}\|Z_2$.

Second trace 1040b can include a third trace segment 1030c and a fourth trace segment 1030d, which can be connected by second attenuator 1025b. Trace segments 1030a-1030d can be collectively referred to as trace segments 1030. Second trace 1040b can be associated with third impedance $Z_3$. Accordingly, third trace segment 1030c may be associated with third impedance $Z_3$ and fourth trace segment 1030d may be associated with third impedance $Z_3$. Second conductor 1005b may be associated with a fourth impedance $Z_4$. Second variable resistor 1015b may be associated with a second resistance $R_2$. Third resistance $R_3$ is the resistance value between the drain and source of second variable resistor 1015b during operation on $R_{DS\ (on)}$. The values of second resistance $R_{S2}$ and fourth impedance $Z_4$ are chosen such that $Z_3=R_2\|Z_4$.

In some examples, the value of first resistance $R_1$ and second resistance $R_2$ may equal total resistance $R_T$ which may be based on a desired loss of computing cable 1010. A lower value of first resistance $R_{S1}$ or second resistance $R_{S2}$ may increase the loss of computing cable 1010. Conversely, a higher value of first resistance $R_1$ or second resistance $R_2$ results in a decrease in the loss of computing cable 1010.

The value of the resistance may be adjusted based on a control input 1050, which is similar to control input 150 of FIG. 1.

Figure 11:
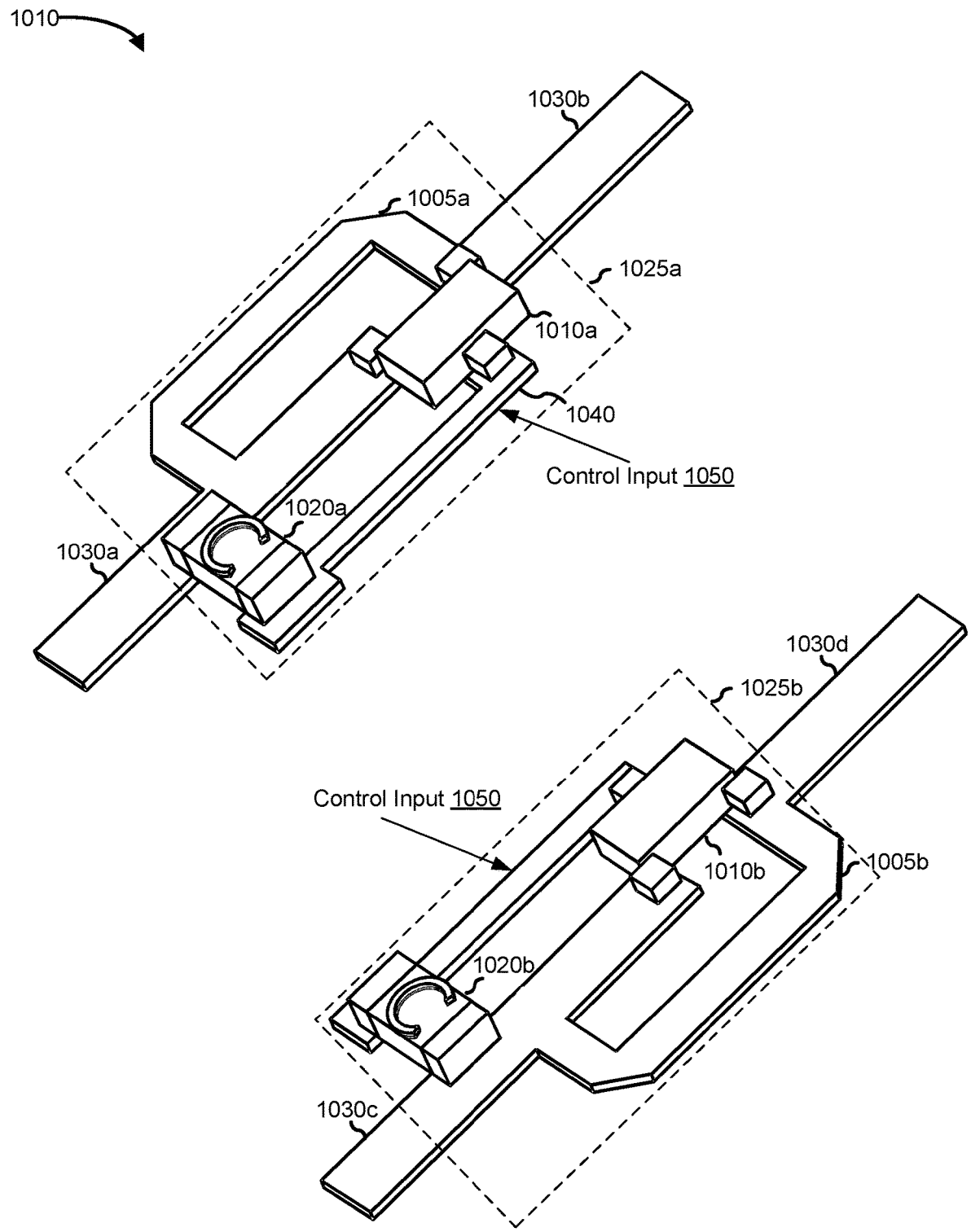
FIG. 11 is a diagram illustrating a top-down perspective view of a computing cable, according to an embodiment of the present disclosure.

FIG. 11 shows a top-down perspective view of computing cable 1010. First attenuator 1025*a* connects first trace segment 1030*a* and second trace segment 1030*b*. Second attenuator 1025*b* connects third trace segment 1030*c* and fourth trace segment 1030*d*. In this example, the length of the loop of first conductor 1005*a* may be used to center first attenuator 1025*a* to a desired frequency range. The length of the loop of second conductor 1005*b* may be used to center second attenuator 1025*b* to a desired frequency range. In addition, the length of conductors 1005 may be based on a wavelength of a signal transmitted along trace segments 1030.

Figure 12:
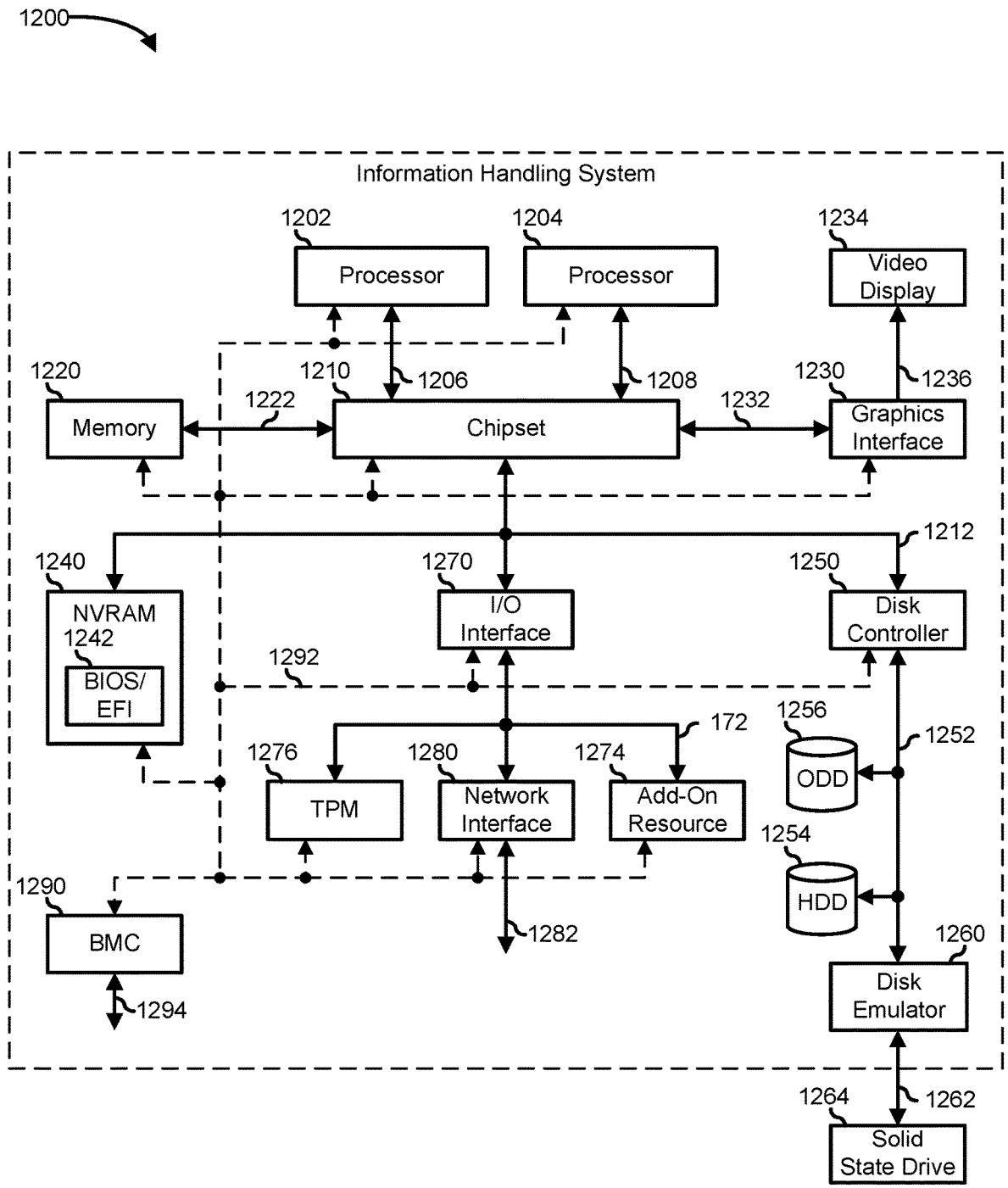
FIG. 12 is a block diagram illustrating an information handling system according to an embodiment of the present disclosure.

FIG. 12 illustrates an embodiment of an information handling system 1200 including processors 1202 and 1204, a chipset 1210, a memory 1220, a graphics adapter 1230 connected to a video display 1234, a non-volatile RAM (NV-RAM) 1240 that includes a basic input and output system/extensible firmware interface (BIOS/EFI) module 1242, a disk controller 1250, a hard disk drive (HDD) 1254, an optical disk drive 1256, a disk emulator 1260 connected to a solid-state drive (SSD) 1264, an input/output (I/O) interface 1270 connected to an add-on resource 1274 and a trusted platform module (TPM) 1276, a network interface 1280, and a BMC 1290. Processor 1202 is connected to chipset 1210 via processor interface 1206, and processor 1204 is connected to the chipset via processor interface 1208. In a particular embodiment, processors 1202 and 1204 are connected together via a high-capacity coherent fabric, such as a HyperTransport link, a QuickPath Interconnect, or the like. Chipset 1210 represents an integrated circuit or group of integrated circuits that manage the data flow between processors 1202 and 1204 and the other elements of information handling system 1200. In a particular embodiment, chipset 1210 represents a pair of integrated circuits, such as a northbridge component and a southbridge component. In another embodiment, some or all of the functions and features of chipset 1210 are integrated with one or more of processors 1202 and 1204.

Memory 1220 is connected to chipset 1210 via a memory interface 1222. An example of memory interface 1222 includes a Double Data Rate (DDR) memory channel and memory 1220 represents one or more DDR Dual In-Line Memory Modules (DIMMs). In a particular embodiment, memory interface 1222 represents two or more DDR channels. In another embodiment, one or more of processors 1202 and 1204 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 1220 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 1230 is connected to chipset 1210 via a graphics interface 1232 and provides a video display output 1236 to a video display 1234. An example of a graphics interface 1232 includes a Peripheral Component Interconnect-Express (PCIe) interface and graphics adapter 1230 can include a four-lane (x4) PCIe adapter, an eight-lane (x8) PCIe adapter, a 16-lane (x16) PCIe adapter, or another configuration, as needed or desired. In a particular embodiment, graphics adapter 1230 is provided down on a system PCB. Video display output 1236 can include a Digital Video Interface (DVI), a High-Definition Multimedia Interface (HDMI), a DisplayPort interface, or the like, and video display 1234 can include a monitor, a smart television, an embedded display such as a laptop computer display, or the like.

NV-RAM 1240, disk controller 1250, and I/O interface 1270 are connected to chipset 1210 via an I/O channel 1212. An example of I/O channel 1212 includes one or more point-to-point PCIe links between chipset 1210 and each of NV-RAM 1240, disk controller 1250, and I/O interface 1270. Chipset 1210 can also include one or more other I/O interfaces, including a PCIe interface, an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. NV-RAM 1240 includes BIOS/EFI module 1242 that stores machine-executable code (BIOS/EFI code) that operates to detect the resources of information handling system 1200, to provide drivers for the resources, to initialize the resources, and to provide common access mechanisms for the resources. The functions and features of BIOS/EFI module 1242 will be further described below.

Disk controller 1250 includes a disk interface 1252 that connects the disc controller to a hard disk drive (HDD) 1254, to an optical disk drive (ODD) 1256, and to disk emulator 1260. An example of disk interface 1252 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1260 permits SSD 1264 to be connected to information handling system 1200 via an external interface 1262. An example of external interface 1262 includes a USB interface, an institute of electrical and electronics engineers (IEEE) 1394 (Firewire) interface, a proprietary interface, or a combination thereof. Alternatively, SSD 1264 can be disposed within information handling system 1200.

I/O interface 1270 includes a peripheral interface 1272 that connects the I/O interface to add-on resource 1274, to TPM 1276, and to network interface 1280. Peripheral interface 1272 can be the same type of interface as I/O channel 1212 or can be a different type of interface. As such, I/O interface 1270 extends the capacity of I/O channel 1212 when peripheral interface 1272 and the I/O channel are of the same type, and the I/O interface translates information from a format suitable to the I/O channel to a format suitable to the peripheral interface 1272 when they are of a different type. Add-on resource 1274 can include a data storage system, an additional graphics interface, a network interface card (NIC), a sound/video processing card, another add-on resource, or a combination thereof. Add-on resource 1274 can be on a main circuit board, on a separate circuit board or add-in card disposed within information handling system 1200, a device that is external to the information handling system, or a combination thereof.

Network interface 1280 represents a network communication device disposed within information handling system 1200, on a main circuit board of the information handling system, integrated onto another component such as chipset 1210, in another suitable location, or a combination thereof. Network interface 1280 includes a network channel 1282 that provides an interface to devices that are external to information handling system 1200. In a particular embodiment, network channel 1282 is of a different type than peripheral interface 1272, and network interface 1280 translates information from a format suitable to the peripheral channel to a format suitable to external devices.

In a particular embodiment, network interface 1280 includes a NIC or host bus adapter (HBA), and an example of network channel 1282 includes an InfiniBand channel, a Fibre Channel, a Gigabit Ethernet channel, a proprietary channel architecture, or a combination thereof. In another embodiment, network interface 1280 includes a wireless communication interface, and network channel 1282 includes a Wi-Fi channel, a near-field communication (NFC) channel, a Bluetooth® or Bluetooth-Low-Energy (BLE) channel, a cellular-based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 1282 can be connected to an external network resource (not illustrated). The network resource can include another information handling system, a data storage system, another network, a grid management system, another suitable resource, or a combination thereof.

BMC 1290 is connected to multiple elements of information handling system 1200 via one or more management interfaces 1292 to provide out-of-band monitoring, maintenance, and control of the elements of the information handling system. As such, BMC 1290 represents a processing device different from processor 1202 and processor 1204, which provides various management functions for information handling system 1200. For example, BMC 1290 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 1290 can vary considerably based on the type of information handling system. BMC 1290 can operate in accordance with an Intelligent Platform Management Interface (IPMI). Examples of BMC 1290 include an Integrated Dell® Remote Access Controller (iDRAC).

Management interface 1292 represents one or more out-of-band communication interfaces between BMC 1290 and the elements of information handling system 1200 and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 1200, that is apart from the execution of code by processors 1202 and 1204 and procedures that are implemented on the information handling system in response to the executed code.

BMC 1290 operates to monitor and maintain system firmware, such as code stored in BIOS/EFI module 1242, option ROMs for graphics adapter 1230, disk controller 1250, add-on resource 1274, network interface 1280, or other elements of information handling system 1200, as needed or desired. In particular, BMC 1290 includes a network interface 1294 that can be connected to a remote management system to receive firmware updates, as needed or desired. Here, BMC 1290 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 1290 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 1290, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 1290 is included on a main circuit board (such as a baseboard, a motherboard, or any combination thereof) of information handling system 1200 or is integrated onto another element of the information handling system such as chipset 1210, or another suitable element, as needed or desired. As such, BMC 1290 can be part of an integrated circuit or a chipset within information handling system 1200. An example of BMC 1290 includes an iDRAC, or the like. BMC 1290 may operate on a separate power plane from other resources in information handling system 1200. Thus BMC 1290 can communicate with the management system via network interface 1294 while the resources of information handling system 1200 are powered off. Here, information can be sent from the management system to BMC 1290 and the information can be stored in a RAM or NV-RAM associated with the BMC. Information stored in the RAM may be lost after power-down of the power plane for BMC 1290, while information stored in the NV-RAM may be saved through a power-down/power-up cycle of the power plane for the BMC.

Information handling system 1200 can include additional components and additional busses, not shown for clarity. For example, information handling system 1200 can include multiple processor cores, audio devices, and the like. While a particular arrangement of bus technologies and interconnections is illustrated for the purpose of example, one of skill will appreciate that the techniques disclosed herein are applicable to other system architectures. Information handling system 1200 can include multiple central processing units (CPUs) and redundant bus controllers. One or more components can be integrated together. Information handling system 1200 can include additional buses and bus protocols, for example, I$^2$C and the like. Additional components of information handling system 1200 can include one or more storage devices that can store machine-executable code, one or more communications ports for communicating with external devices, and various input and output (I/O) devices, such as a keyboard, a mouse, and a video display.

For purposes of this disclosure, information handling system 1200 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1200 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 1200 can include processing resources for executing machine-executable code, such as processor 1202, a programmable logic array (PLA), an embedded device such as a System-on-a-Chip (SoC), or other control logic hardware. Information handling system 1200 can also include one or more computer-readable media for storing machine-executable code, such as software or data.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein. One of skill in the art will appreciate that the circuit(s) herein explains a typical example, which can be extended in practice.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that causes a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A computing cable comprising:
    a trace having a first impedance; and
    an attenuator including:
        a variable resistor having a first resistance that is varied dynamically at runtime, wherein the first resistance is varied to adjust a channel loss; and
        a conductor having a second impedance.

2. The computing cable of claim 1, wherein the first resistance is varied based on gate-to-source voltage.

3. The computing cable of claim 1, wherein the channel loss is adjusted until reflections in the computing cable are gone.

4. The computing cable of claim 1, wherein the first resistance is varied based on a length of the computing cable.

5. The computing cable of claim 1, wherein the first resistance is varied based on channel variations.

6. The computing cable of claim 1, wherein the variable resistor has a strong drain-source on resistance dependence on gate-to-source voltage.

7. The computing cable of claim 1, wherein the attenuator further includes a fixed resistor having a second resistance.

8. The computing cable of claim 7, wherein the combination of the first resistance, the second resistance, and the second impedance is equal to the first impedance.

9. The computing cable of claim 1, wherein the variable resistor is a field-effect transistor.

10. The computing cable of claim 1, wherein the first resistance is set via a bias voltage.

11. A computing cable comprising:
    a first signal transmission element including:
        a first trace having a first impedance; and
        a first attenuator including:
            a first variable resistor having a first resistance; and
            a first conductor having a second impedance;
    a second signal transmission element including:
        a second trace having a third impedance; and
        a second attenuator including:

a second variable resistor having a second resistance, wherein the first resistance and the second resistance are based on a length of the computing cable; and a second conductor having a fourth impedance.

12. The computing cable of claim 11, wherein the first resistance is adjusted based on gate-to-source voltage.

13. The computing cable of claim 11, wherein the second attenuator further includes a first fixed resistor having a third resistance.

14. The computing cable of claim 13, wherein the first resistance and the third resistance are varied at runtime based on another length of the computing cable.

15. The computing cable of claim 13, wherein the first resistance and the third resistance are varied at runtime based on channel variations.

16. The computing cable of claim 11, wherein the first variable resistor and the second variable resistor have strong drain-source on resistance dependence on gate-to-source voltage.

17. The computing cable of claim 11, wherein the first variable resistor and the second variable resistor are field-effect transistors.

18. A computing cable comprising:
a trace having a first impedance; and
an attenuator including a conductor having a second impedance that is based on the first impedance.

19. The computing cable of claim 18, wherein the attenuator further includes a variable resistor having a resistance that is based on a length of the computing cable.

20. The computing cable of claim 19, wherein the resistance is varied at runtime based on the length of the computing cable.

* * * * *